US012151936B2

(12) United States Patent
Weber et al.

(10) Patent No.: US 12,151,936 B2
(45) Date of Patent: Nov. 26, 2024

(54) MICROMECHANICAL COMPONENT FOR A SENSOR DEVICE OR MICROPHONE DEVICE

(71) Applicant: Robert Bosch GmbH, Stuttgart (DE)

(72) Inventors: Heribert Weber, Nuertingen (DE); Andreas Scheurle, Leonberg (DE); Christoph Hermes, Kirchentellinsfurt (DE); Peter Schmollngruber, Aidlingen (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 292 days.

(21) Appl. No.: 17/776,354

(22) PCT Filed: Jan. 12, 2021

(86) PCT No.: PCT/EP2021/050428
§ 371 (c)(1),
(2) Date: May 12, 2022

(87) PCT Pub. No.: WO2021/144237
PCT Pub. Date: Jul. 22, 2021

(65) Prior Publication Data
US 2022/0396477 A1 Dec. 15, 2022

(30) Foreign Application Priority Data
Jan. 14, 2020 (DE) ...................... 10 2020 200 334.3

(51) Int. Cl.
B81C 1/00 (2006.01)
B81B 7/00 (2006.01)
(Continued)

(52) U.S. Cl.
CPC ........ B81C 1/00801 (2013.01); B81B 7/0025 (2013.01); G01L 1/142 (2013.01);
(Continued)

(58) Field of Classification Search
CPC ............................ H04R 19/04; H04R 31/003; H04R 2201/003; B81B 2201/0257
See application file for complete search history.

(56) References Cited

U.S. PATENT DOCUMENTS

2015/0061049 A1  3/2015 Weber
2015/0253212 A1* 9/2015 Hayashi ............... G01L 9/0073
                                                            438/52
2017/0297896 A1 10/2017 Graham et al.

FOREIGN PATENT DOCUMENTS

DE  102007029414 A1  1/2009
DE  102010000864 A1  7/2011
(Continued)

OTHER PUBLICATIONS

International Search Report for PCT/EP2021/050428, Issued Apr. 28, 2021.

Primary Examiner — Sunita Joshi
(74) Attorney, Agent, or Firm — Norton Rose Fulbright US LLP; Gerard A. Messina

(57) ABSTRACT

A micromechanical component for a sensor device or microphone device. The micromechanical component includes a diaphragm with a diaphragm inner side to which an electrode structure is directly or indirectly connected; and a cavity that is formed at least in a volume that is exposed by at least one removed area of at least one sacrificial layer. At least one residual area made of at least one electrically insulating sacrificial layer material of the at least one sacrificial layer is also present at the micromechanical component, and including at least one insulation area made of at least one electrically insulating material that is not the same
(Continued)

as the electrically insulating sacrificial layer material. The electrode structure is electrically insulated from the diaphragm, and/or the at least one residual area of the at least one sacrificial layer is delimited from the cavity, using the at least one insulation area.

10 Claims, 10 Drawing Sheets

(51) Int. Cl.
*G01L 1/14* (2006.01)
*H04R 19/04* (2006.01)
*H04R 31/00* (2006.01)

(52) U.S. Cl.
CPC ........... *H04R 19/04* (2013.01); *H04R 31/003* (2013.01); *B81B 2201/0257* (2013.01); *B81B 2201/0264* (2013.01); *B81B 2203/0127* (2013.01); *B81B 2203/04* (2013.01); *B81C 2201/0109* (2013.01); *H04R 2201/003* (2013.01)

(56) References Cited

FOREIGN PATENT DOCUMENTS

| | | |
|---|---|---|
| JP | 2015169465 A | 9/2015 |
| JP | 2016170089 A | 9/2016 |

\* cited by examiner

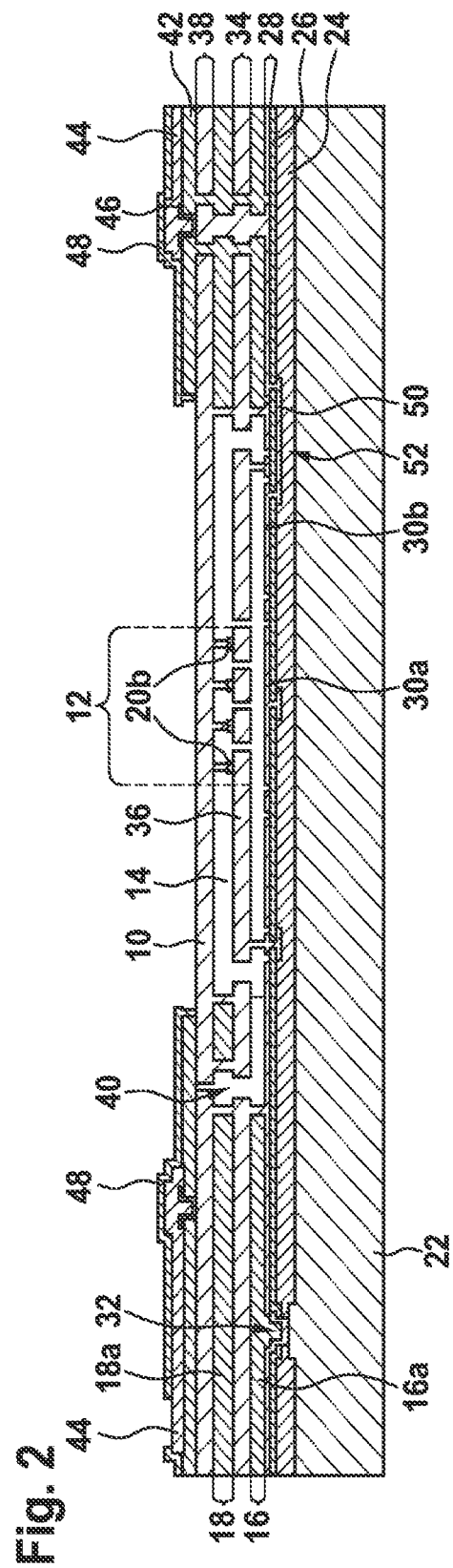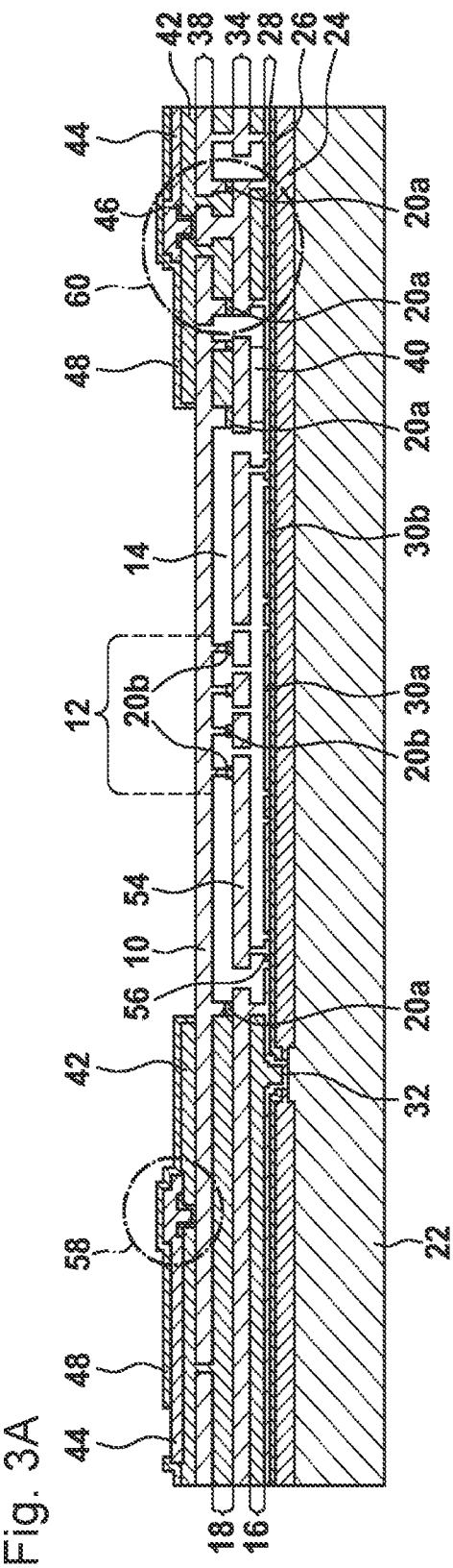

MICROMECHANICAL COMPONENT FOR A SENSOR DEVICE OR MICROPHONE DEVICE

FIELD

The present invention relates to a micromechanical component for a sensor device or microphone device. Moreover, the present invention relates to a manufacturing method for a micromechanical component for a sensor device or microphone device.

BACKGROUND INFORMATION

German Patent Application No. DE 10 2007 029 414 A1 describes a capacitive pressure sensor with an adjustable electrode that protrudes with respect to a substrate and is formed at the diaphragm of the capacitive pressure sensor.

SUMMARY

The present invention provides a micromechanical component for a sensor device or microphone device, and a manufacturing method for a micromechanical component for a sensor device or microphone device.

Due to the design according to the present invention of the at least one sacrificial layer of a micromechanical component that is provided with the aid of the present invention, made up of at least one electrically insulating sacrificial layer material, and the at least one insulation area of the same micromechanical component, made of at least one electrically insulating material that is not the same as the at least one electrically insulating sacrificial layer material, for forming the cavity of the micromechanical component a process that is suitable for partially removing the at least one sacrificial layer may be carried out without concern for damage or removal of the at least one insulation area. The present invention thus facilitates providing the particular micromechanical component according to the present invention with the at least one insulation area, which is advantageously suitable for electrically insulating the electrode structure from the diaphragm, for electrical insulation between the diaphragm material layer and the electrode material layer, and/or for delimiting the at least one residual area of the at least one sacrificial layer from the cavity. The present invention thus improves a micromechanical component according to the present invention over the related art, and also contributes to reducing the expenditure of labor for manufacturing the micromechanical component according to the present invention and reducing the manufacturing costs of the micromechanical component according to the present invention.

The at least one insulation area utilized for delimiting the at least one residual area of the at least one sacrificial layer, in particular as "etch protection," may prevent undesirable etching of the at least one residual area during formation of the cavity. At the same time, the formation of the at least one insulation area, utilized for delimiting the at least one residual area and made of the at least one electrically insulating material, allows a delimitation of conduction paths by the particular micromechanical component.

In one advantageous specific example embodiment of the micromechanical component of the present invention, the at least one residual area is made of silicon dioxide or silicon-rich silicon nitride. The at least one sacrificial layer in the cavity in this case is preferably made of silicon dioxide. Silicon dioxide may be etched using a variety of etching media, as the result of which forming the cavity by partially removing the at least one sacrificial layer formed from silicon dioxide may be easily carried out.

In accordance with an example embodiment of the present invention, the at least one insulation area is preferably made of silicon nitride, silicon-rich silicon nitride, silicon carbide, and/or aluminum oxide as the at least one electrically insulating material. The materials listed here have an advantageous etch resistance to a variety of etching media, so that the at least one sacrificial layer may be etched without concern for damage or removal of the at least one insulation area.

In particular, the at least one residual area made of silicon dioxide may be the at least one electrically insulating sacrificial layer material, while the at least one insulation area made of silicon nitride, silicon-rich silicon nitride, silicon carbide, and/or aluminum oxide is the at least one electrically insulating material. In this case, hydrogen fluoride gas phase etching may be carried out for forming the cavity, the at least one insulation area being hardly attacked or not attacked at all due to the advantageous etch resistance of silicon nitride, silicon-rich silicon nitride, silicon carbide, and aluminum oxide (with respect to hydrogen fluoride). The specific embodiment of the micromechanical component described here is thus manufacturable in a relatively cost-effective manner with the aid of method steps that may be easily carried out.

As one advantageous refinement of the micromechanical component of the present invention, at least one conductive component may electrically contact a wiring layer, which as at least one intermediate layer at least partially covers a substrate surface of a substrate, the electrode structure being electrically connected to the at least one conductive component via at least one spring-shaped strip conductor, and the at least one conductive component, the at least one spring-shaped strip conductor, and the electrode structure being formed from the same electrode material layer. As explained in greater detail below, the at least one spring-shaped strip conductor may advantageously be used for electrically contacting the electrode structure, although the electrode structure is adjustable by bending the diaphragm. In addition, due to forming the at least one spring-shaped strip conductor and the electrode structure from the same electrode material layer, the expenditure of labor for forming the at least one spring-shaped strip conductor is relatively low.

The advantages described above may also be ensured by carrying out a corresponding manufacturing method for a micromechanical component for a sensor device or microphone device.

In one advantageous specific embodiment of the manufacturing method of the present invention, the removal of the at least one area of the at least one sacrificial layer from the at least one electrically insulating sacrificial layer material takes place by etching the particular area of the at least one sacrificial layer with an etching medium for which the at least one electrically insulating material of the at least one insulation area has a higher etch resistance than the at least one electrically insulating sacrificial layer material. By suitably selecting an etching medium, it is thus possible to form the cavity without accepting damage or removal of the at least one insulation area.

In a further advantageous specific embodiment of the manufacturing method, for establishing the volume of the subsequent cavity and for forming the electrode structure, a substrate surface of a substrate and/or at least one intermediate layer that at least partially covers the substrate surface are/is covered with a first sacrificial layer as the at least one sacrificial layer made of the at least one electrically insulating sacrificial layer material, a side of the first sacrificial layer directed away from the substrate is at least partially covered with an electrode material layer in such a way that the electrode structure is formed from at least partial areas of the electrode material layer, and a side of the electrode material layer directed away from the first sacrificial layer is at least partially covered with a second sacrificial layer as the at least one sacrificial layer made of the at least one electrically insulating sacrificial layer material. The method steps described here may be carried out comparatively easily, with comparatively low costs incurred for carrying them out.

BRIEF DESCRIPTION OF THE DRAWINGS

Further features and advantages of the present invention are explained below with reference to the figures.

FIGS. 2 through 13B show schematic illustrations or partial illustrations of further specific example embodiments of the micromechanical component of the present invention.

DETAILED DESCRIPTION OF EXAMPLE EMBODIMENTS

Figure 1A:
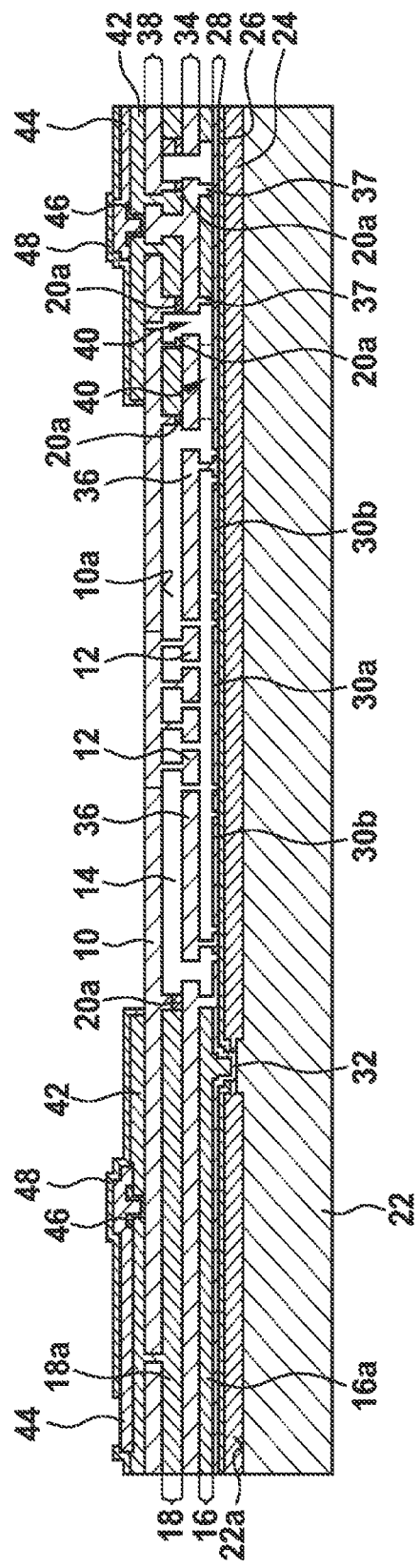
FIGS. 1A and 1B respectively show a schematic illustration of one specific example embodiment of the micromechanical component of the present invention, and a flowchart for explaining one specific example embodiment of the manufacturing method of the present invention for a micromechanical component for a sensor device or microphone device.
Figure 1B:
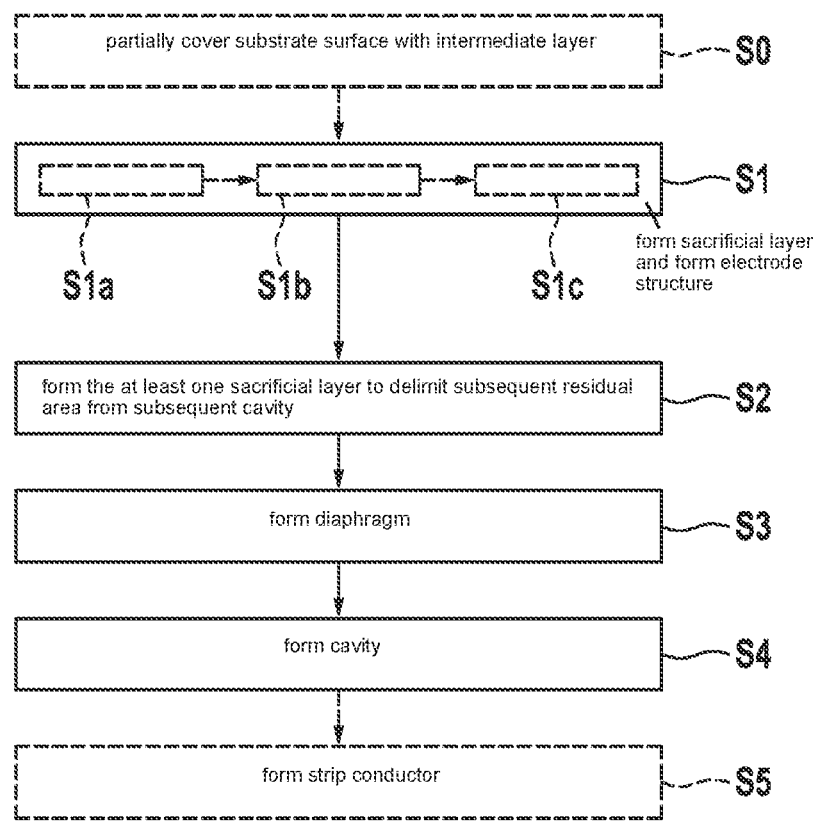

FIGS. 1A and 1B respectively show a schematic illustration of one specific embodiment of the micromechanical component, and a flowchart for explaining one specific embodiment of the manufacturing method for a micromechanical component for a sensor device or microphone device.

The micromechanical component schematically depicted in FIG. 1A includes a diaphragm 10 with a diaphragm inner side 10a, an electrode structure 12, at least in part, being directly or indirectly connected to diaphragm inner side 10a. Electrode structure 12 effectuates an advantageous reinforcement of diaphragm 10, and may have a design that is perforated over the full surface or at least partially perforated. A cavity 14 of the micromechanical component, at least in a volume that is exposed by at least one removed area of at least one sacrificial layer 16 and 18, is designed in such a way that diaphragm inner side 10a of diaphragm 10 adjoins cavity 14. In addition, electrode structure 12, which is directly or indirectly connected to diaphragm inner side 10a, is at least partially enclosed by cavity 14. That the cavity 14 is formed at least in the volume that is exposed by the at least one removed area of the at least one sacrificial layer 16 and 18 is apparent from the fact that at least one residual area 16a and 18a made of at least one electrically insulating sacrificial layer material of the at least one sacrificial layer 16 and 18 is also present at the micromechanical component.

In addition, the micromechanical component includes at least one insulation area 20a made of at least one electrically insulating material that is not the same as the at least one electrically insulating sacrificial layer material. In the specific embodiment of FIGS. 1A and 1B, the at least one residual area 16a and 18a of the at least one sacrificial layer 16 and 18 is delimited from cavity 14 with the aid of the at least one insulation area 20a. A further use for such insulation areas made of the at least one electrically insulating material that is not the same as the at least one electrically insulating sacrificial layer material is discussed below.

The at least one residual area 16a and 18a of the at least one sacrificial layer 16 and 18 is preferably made of silicon dioxide as the at least one electrically insulating sacrificial layer material. In this case, the at least one insulation area 20a is preferably made of silicon nitride, silicon-rich silicon nitride, silicon carbide, and/or aluminum oxide as the at least one electrically insulating material. As explained in greater detail below, this facilitates manufacturability of the micromechanical component.

The micromechanical component of FIG. 1A may be manufactured with the aid of the manufacturing method schematically depicted in FIG. 1B. Therefore, further features of the micromechanical component of FIG. 1A are discussed in the description of the manufacturing method of FIG. 1B:

In the manufacturing method described here, a volume of subsequent cavity 14 of the subsequent micromechanical component is established in a method step S1 at least by forming the at least one sacrificial layer 16 and 18 from the at least one electrically insulating sacrificial layer material. In addition, electrode structure 12 that is at least partially enclosed by the volume of subsequent cavity 14 is formed in method step S1.

Optionally, however, a method step S0 may also be carried out prior to method step S1. A substrate surface 22a of a substrate 22 may be at least partially covered with at least one intermediate layer 24 through 28 as method step S0. Substrate 22 may in particular be a silicon substrate. As the at least one intermediate layer 24 through 28, for example at least one insulating layer 24 and 26, such as a silicon dioxide layer 24 and/or a silicon-rich silicon nitride layer 26 in particular, may be deposited on substrate surface 22a of substrate 22. Optionally, a wiring layer 28 may also be deposited on substrate surface 22a and/or the at least one insulating layer 24 and 26 as the at least one intermediate layer 24 through 28. At least one counter electrode 30a and 30b, for example, may be formed from wiring layer 28; the function of this counter electrode is explained in greater detail below. At least one substrate contact 32 may also optionally be formed by depositing wiring layer 28 on parts of substrate surface 22a. Furthermore, at least one inflexible strip conductor (not illustrated) and/or at least one electrical contact (not illustrated) may also be formed from wiring layer 28. Wiring layer 28 may in particular be made of doped silicon/polysilicon and/or a metal, for example aluminum, and/or a metal-containing layer, for example a metal silicide.

Method step S1, which is carried out to establish the volume of subsequent cavity 14 and to form electrode structure 12, may include multiple substeps S1a through S1c. Initially, substrate surface 22a of substrate 22 and/or the at least one intermediate layer 24 through 28 that at least partially covers substrate surface 22a may be covered with a first sacrificial layer 16 as the at least one sacrificial layer 16 and 18 made of the at least one electrically insulating sacrificial layer material, in a substep S1a. A side of first sacrificial layer 16 directed away from substrate 22 may subsequently be at least partially covered with an electrode material layer 34, as substep S1b, in such a way that (at least) electrode structure 12 is formed from at least partial areas of electrode material layer 34. At least one reference electrode 36 may also be selectively formed from electrode material layer 34. While electrode structure 12 together with a counter electrode 30a formed from wiring layer 28 may cooperate as a measuring capacitor, the at least one reference electrode 36, together with at least one reference counter electrode 30b that is likewise formed from and associated with wiring layer 28, may form a reference capacitor. At least one contact 37 between wiring layer 28 and electrode material layer 34 may optionally also be formed from the material of electrode material layer 34. Electrode material layer 34 may be formed from doped silicon/polysilicon, for example. After substep S1b, a substep S1c may be carried out in which a side of electrode material layer 34 directed away from first sacrificial layer 16 is at least partially covered with a second sacrificial layer 18 as the at least one sacrificial layer 16 and 18 made of the at least one electrically insulating sacrificial layer material.

In a method step S2 of the manufacturing method described here, the at least one insulation area 20a made of the at least one electrically insulating material that is not the same as the at least one electrically insulating sacrificial layer material is formed in such a way that the at least one subsequent residual area 16a and 18a of the at least one sacrificial layer 16 and 18 is delimited from the subsequent cavity with the aid of the at least one insulation area 20a. This is easily possible by depositing the at least one electrically insulating material on partial surfaces of electrode material layer 34 that are kept free/exposed by second sacrificial layer 18. By use of a subsequent process, for example a plasma etching process and/or a chemical mechanical polishing (CMP) process, the at least one electrically insulating material may be removed from second sacrificial layer 18 in such a way that it remains only in areas of second sacrificial layer 18 that have been removed for: any way to clarify/separate "that it remains only in areas . . . that have been removed keeping free/exposing partial surfaces of electrode material layer 34.

Alternatively, the at least one electrically insulating material may also be applied to electrode material layer 34 and structured. If partial surfaces of the at least one electrically insulating material are exposed on electrode material layer 34 after applying second sacrificial layer 18, material of a diaphragm material layer 38 may be deposited in the at least one removed area of second sacrificial layer 18 (in a subsequent step S3). In this way it is possible to provide at least one area in which a diaphragm material layer 38 is brought into direct contact with an electrode material layer 34, for example to establish an electrical contact between the two layers, and at the same time to provide at least one area in which an insulation area 20a prevents the formation of an electrical contact. Areas in which the formation of an electrical contact is prevented may advantageously be used to delimit the at least one residual area 16a and 18a of the at least one sacrificial layer 16 and 18 from the subsequent cavity.

In a further method step S3 of the manufacturing method described here, diaphragm 10 of the subsequent micromechanical component together with diaphragm inner side 10a that delimits subsequent cavity 14 is formed, electrode structure 12 being directly or indirectly connected to diaphragm inner side 10a. To form diaphragm 10, for example a diaphragm material layer 38 may be deposited on second sacrificial layer 18, on kept free/exposed partial surfaces of electrode material layer 34, and/or on the at least one insulation area 20a. Diaphragm material layer 38 may be formed from doped silicon/polysilicon, for example. As is apparent in FIG. 1A, electrode structure 12 is directly affixable to diaphragm 10, directly on at least one kept free/exposed partial surface of electrode structure 12, with the aid of a deposition of diaphragm material layer 38.

Cavity 14 is formed with the aid of a method step S4, method step S4 including at least a removal of at least one area of the at least one sacrificial layer 16 and 18 from the at least one electrically insulating sacrificial layer material, and being carried out in such a way that diaphragm inner side 10a of the diaphragm adjoins cavity 14, and electrode structure 12 that is directly or indirectly connected to diaphragm inner side 10a is at least partially enclosed by cavity 14. After carrying out method step S4, the at least one residual area 16a and 18a of the at least one sacrificial layer 16 and 18 made of the at least one electrically insulating sacrificial layer material still remains at the micromechanical component.

The removal of the at least one area of the at least one sacrificial layer 16 and 18 made of the at least one electrically insulating sacrificial layer material preferably takes place by etching the particular area of the at least one sacrificial layer 16 and 18 with an etching medium for which the at least one electrically insulating material of the at least one insulation area 20a has a significantly higher etch resistance than the at least one electrically insulating sacrificial layer material. If the at least one sacrificial layer 16 and 18 is formed (solely) from silicon dioxide as the at least one electrically insulating sacrificial layer material, and the at least one insulation area 20a is formed (solely) from silicon nitride, silicon-rich silicon nitride, silicon carbide, and/or aluminum oxide as the at least one electrically insulating material, the etching medium may be, for example, hydrogen fluoride in liquid or gaseous form. By using hydrogen fluoride in liquid or gaseous form as the etching medium, the at least one area of the at least one sacrificial layer 16 and 18 may be quickly and reliably removed without concern for undesirable (accompanying) etching of the at least one insulation area 20a.

While method step S4 is being carried out, the at least one insulation area 20a thus ensures that electrical insulation between diaphragm material layer 38 and electrode material layer 34 takes place locally or at defined locations, and the at least one desired residual area 16a and 18a of the at least one sacrificial layer 16 and 18 remains at the micromechanical component. Thus, there is no need for concern for (undesirable or undefined) lateral etchings extending into the at least one residual area 16a and 18a and/or of stability problems occurring with the fully manufactured micromechanical component as the result of completely removing the at least one sacrificial layer 16 and 18.

The etching medium used to carry out method step S4 may be led via at least one etching channel 40, for example. The at least one etching channel 40 may (for completion of method step S4) be closed media-tight and/or airtight with the aid of at least one closure layer 42, for example. The at least one closure layer 42 may optionally be an electrically insulating layer, for example a silicon dioxide layer, a silicon nitride layer, a silicon-rich silicon nitride layer, a silicon carbide layer, and/or an aluminum oxide layer, and/or an electrically conductive layer, for example a metal layer, a combination of metal layers, and/or a semiconductor layer, for example silicon, doped silicon, germanium, and/or doped germanium. As an alternative to the at least one closure layer 42, a eutectic may also be used for closing the at least one etching channel 40. As eutectic, in particular a gold-silicon eutectic, a gold-germanium eutectic, a eutectic containing gold, silicon, and germanium, an aluminum-germanium eutectic, or a eutectic containing aluminum and/or germanium and/or silicon and/or copper may be formed for closing the at least one etching channel 40. Likewise, a laser seal process for closing the at least one etching channel 40 may be carried out with the aid of a melted-on material of diaphragm material layer 38, of the at least one sacrificial layer 16 and 18, of electrode material layer 34, of substrate 22, of an intermediate layer 24 through 28, and/or of at least one layer made of gold, germanium, aluminum, silicon, and/or copper, for example, that is additionally applied to diaphragm material layer 38.

As optional method step S5, at least one strip conductor 44, in particular including a diffusion barrier 46, may be formed at the micromechanical component and may electrically contact diaphragm material layer 38 at at least one location. The at least one strip conductor 44 may optionally be at least partially covered with a passivation layer 48, and may be at least partially situated on an electrically insulating layer, for example closure layer 42.

FIG. 2 shows a schematic illustration of a second specific embodiment of the micromechanical component.

In contrast to the specific embodiment described above, in the micromechanical component of FIG. 2, electrode structure 12 is electrically insulated from diaphragm 10 with the aid of the at least one insulation area 20b made of the at least one electrically insulating material. This is possible by forming the at least one insulation area 20b made of the at least one electrically insulating material, with the aid of method step S2 of the manufacturing method described above, in such a way that electrode structure 12 is electrically insulated from (subsequent) diaphragm 10 with the aid of the at least one insulation area 20b. Silicon nitride, silicon-rich silicon nitride, silicon carbide, and/or aluminum oxide may be used as the at least one electrically insulating material for the at least one insulation area 20b as well.

As is further apparent in FIG. 2, an electrical "underpass" 52 may also be formed at the micromechanical component with the aid of at least one strip conductor 50 that is formed between the two insulating layers 24 and 26. With the aid of the at least one electrical "underpass" 52, conduction paths utilized for the contacting may be more easily routed separately from the at least one etching channel 40, and/or "electrical crossovers" may be implemented. Due to the location of strip conductor 50 between the two insulating layers 24 and 26, when silicon-rich nitride is used for insulating layer 26 it is possible that during the removal of sacrificial layer 16, 18 made of silicon oxide, no etching attack occurs on insulating layer 24, also made of silicon oxide, as the result of which undercuttings of strip conductors 50 in the cavity area are avoided. An electrical connection between a strip conductor 50 and at least one partial area of wiring layer 28, for example for a counter electrode 30a and/or for a reference counter electrode 30b, may take place via contact holes within insulating layer 26. The formation of the at least one electrical "underpass" 52 (in optional method step S0) may thus contribute to extending the service life of the micromechanical component and/or simplifying strip conductor routings and/or increasing wiring complexity of the micromechanical component.

With regard to further properties and features of the micromechanical component of FIG. 2 and a manufacturing method that is suitable for manufacturing same, reference is made to the preceding specific embodiment.

Figure 3B:
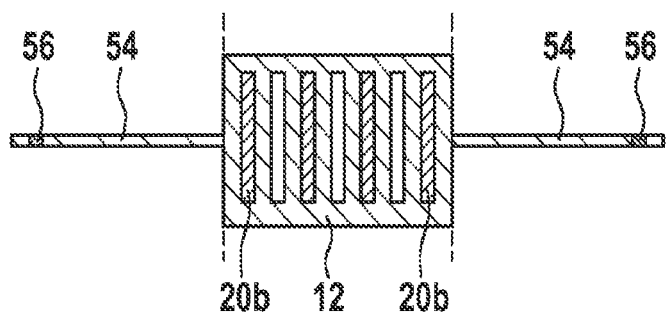

FIGS. 3A and 3B show schematic illustrations of a third specific embodiment of the micromechanical component.

The micromechanical component schematically depicted in FIGS. 3A and 3B includes the at least one insulation area 20a for delimiting the at least one residual area 16a and 18a of the at least one sacrificial layer 16 and 18 from cavity 14, as well as the at least one insulation area 20b for insulating electrode structure 12 from diaphragm 10. In addition, the micromechanical component of FIGS. 3A and 3B includes at least one spring-shaped strip conductor 54 via which electrode structure 12 is electrically connected to wiring layer 28 at at least one conductive component 56 that is formed from electrode material layer 34. Electrical contacting of electrode structure 12 is thus possible despite the at least one insulation area 20b (for electrically insulating electrode structure 12 from diaphragm 10). The at least one conductive component 56 formed from material layer 34 may be designed, for example, as at least one strip conductor and/or as at least one electrical contact for electrically contacting wiring layer 28.

The at least one spring-shaped strip conductor 54 may be situated "outside electrode structure 12," i.e., connected to at least one outer side of electrode structure 12, and/or "inside electrode structure 12," i.e., within a volume that is framed by electrode structure 12. Electrode structure 12 is preferably electrically contactable in each case via an even total number of multiple spring-shaped strip conductors 54. Spring-shaped strip conductors 54 preferably have a mirror-symmetrical design with respect to at least one mirror symmetry plane that centrally intersects electrode structure 12, or point-symmetrically with respect to a midpoint of electrode structure 12.

An electrical contacting 58 of diaphragm 10 and an electrical contacting 60 of wiring layer 28 are also depicted in FIG. 3A.

In addition to electrode structure 12 made of electrode material layer 34, the at least one spring-shaped strip conductor 54 may be formed in method step S1/substep S1b in such a way that electrode structure 12 is electrically connected to wiring layer 28, at the at least one conductive component 56 formed from electrode material layer 34, via the at least one spring-shaped strip conductor 54. As is apparent in FIG. 3B, the at least one spring-shaped strip conductor 54 may be designed, for example, as a web-shaped spring that extends along a center axis.

With regard to further properties and features of the micromechanical component of FIGS. 3A and 3B and a manufacturing method that is suitable for manufacturing same, reference is made to the preceding specific embodiments.

Figure 4:
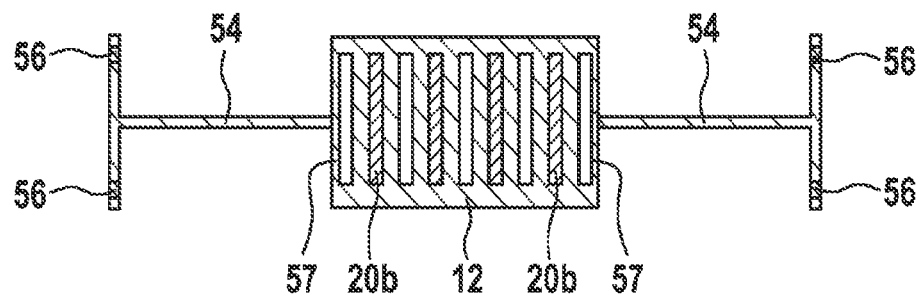
Figure 5:
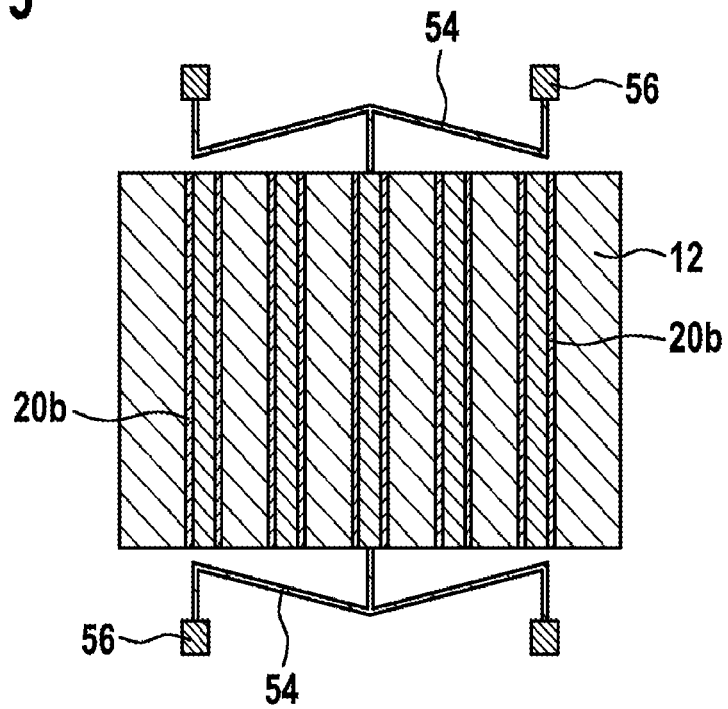

FIGS. 4 and 5 respectively show a schematic partial illustration of a fourth and fifth specific embodiment of the micromechanical component.

As is apparent in each of FIGS. 4 and 5, the at least one spring-shaped strip conductor 54 designed as a web-shaped spring may also include a branch/fork at its end directed away from electrode structure 12. In this case, the two ends of the branch/fork may electrically contact wiring layer 28 via a conductive component 56 in each case that is formed from electrode material layer 34. The branch/fork may be formed as a branch/fork with a design that is perpendicular to the axis of the web-shaped spring (FIG. 4), with a design that is angled with respect to the axis of the web-shaped spring branch/fork (FIG. 5), or as a rounded branch/fork. In addition, the at least one strip conductor 54 may be connected to electrode structure 12 via at least one torsion spring structure 57.

With regard to further properties and features of the micromechanical components of FIGS. 4 and 5 and a manufacturing method that is suitable for manufacturing same, reference is made to the preceding specific embodiments.

Figure 6:
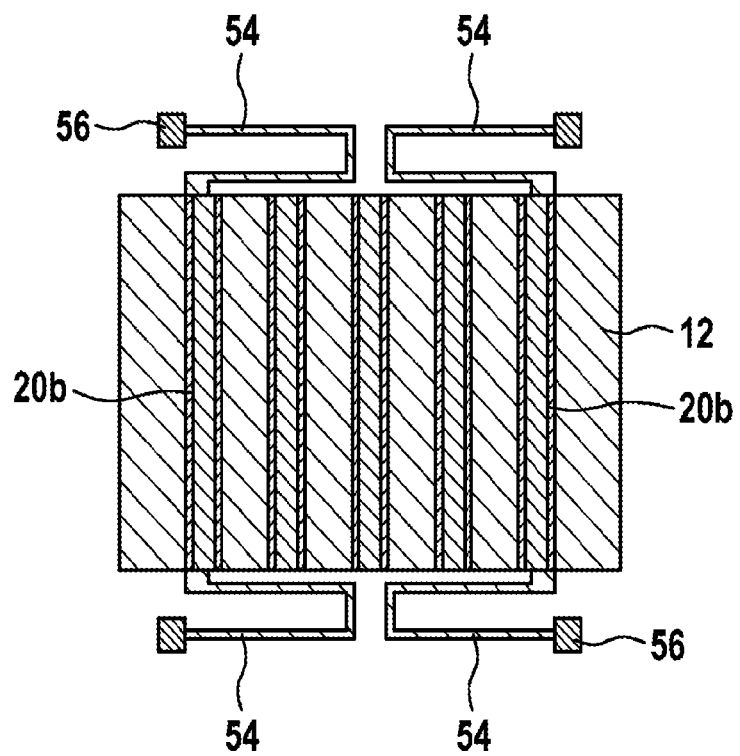
Figure 7:
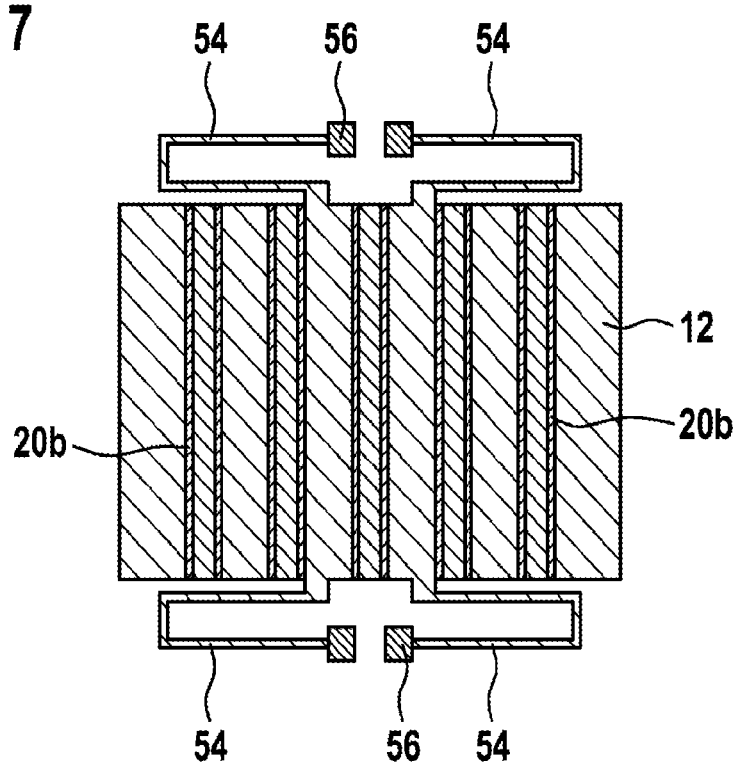

FIGS. 6 and 7 respectively show a schematic partial illustration of a sixth and seventh specific embodiment of the micromechanical component.

As an alternative or in addition to at least one spring-shaped strip conductor 54 that is designed as a web-shaped spring, the at least one spring-shaped strip conductor 54 may be designed in the form of a U spring. The at least one U spring may in each case include two outer sections extending in parallel to one another, and a middle section that connects the two outer sections. For example, two U springs in each case, as spring-shaped strip conductors 54, may be formed at two oppositely directed sides of electrode structure 12. The two U springs situated on the same side of electrode structure 12 may optionally be situated in such a way that their middle portions are oriented toward one another (FIG. 6), or that their middle portions are oriented away from one another (FIG. 7). In addition, the two outer sections of the at least one U spring extending in parallel to one another may have different lengths. Furthermore, the middle section connecting the two outer sections may have the same length as or a different length than the web-shaped section that connects the at least one U spring to electrode structure 12. Moreover, multiple U springs may be connected in series. In principle, it is possible to affix spring structures at arbitrary locations at the circumference of electrode structure 12.

With regard to further properties and features of the micromechanical components of FIGS. 6 and 7 and a manufacturing method that is suitable for manufacturing same, reference is made to the preceding specific embodiments.

Figure 8:
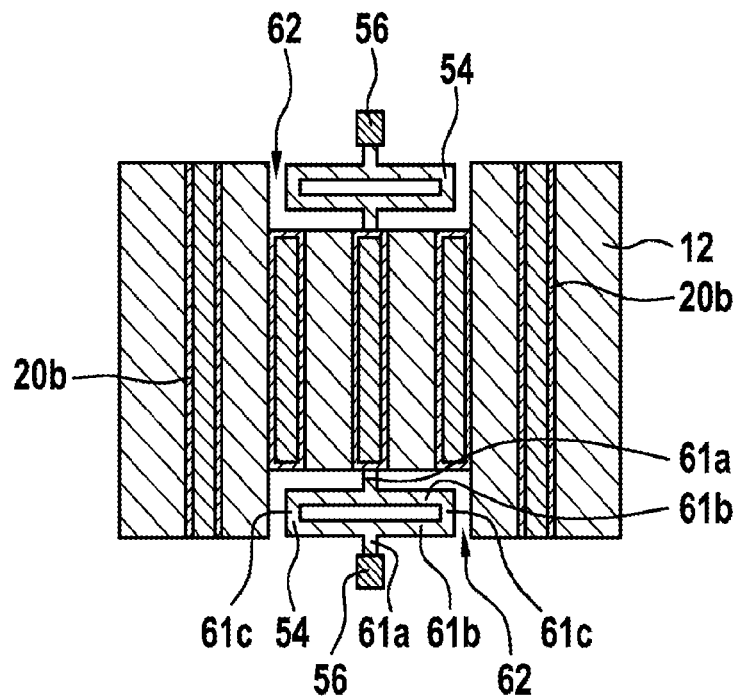

FIG. 8 shows a schematic partial illustration of an eighth specific embodiment of the micromechanical component.

As an alternative or in addition to the forms of the at least one spring-shaped strip conductor 54 described above, the at least one spring-shaped strip conductor 54 may be designed in the form of an O spring. The at least one O spring may include in each case two outer sections 61a extending along an axis, two intermediate sections 61b extending perpendicularly with respect to the axis, and two middle sections 61c extending in parallel to the axis, the two intermediate sections 61b being connected to one another via each of middle sections 61c, and each outer section 61a being connected to another intermediate section 61b. All the above-described forms of the at least one spring-shaped strip conductor 54 may also protrude into a recess 62 that is formed at electrode structure 12.

With regard to further properties and features of the micromechanical component of FIG. 8 and a manufacturing method that is suitable for manufacturing same, reference is made to the preceding specific embodiments.

Figure 9:
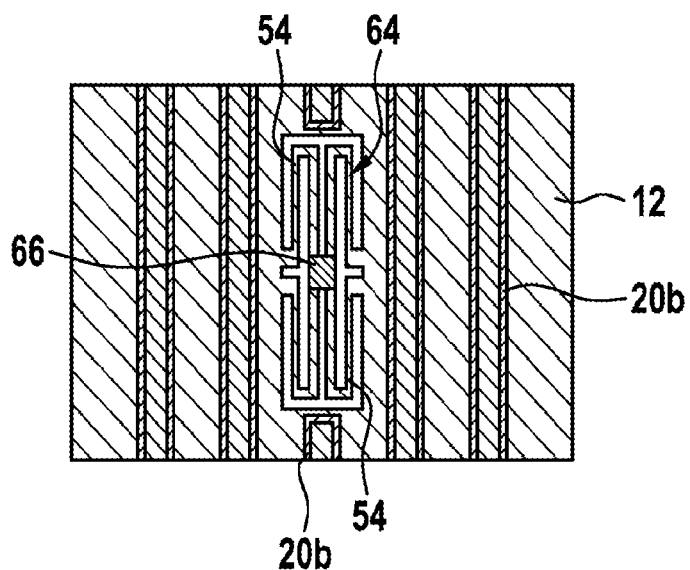
Figure 10:
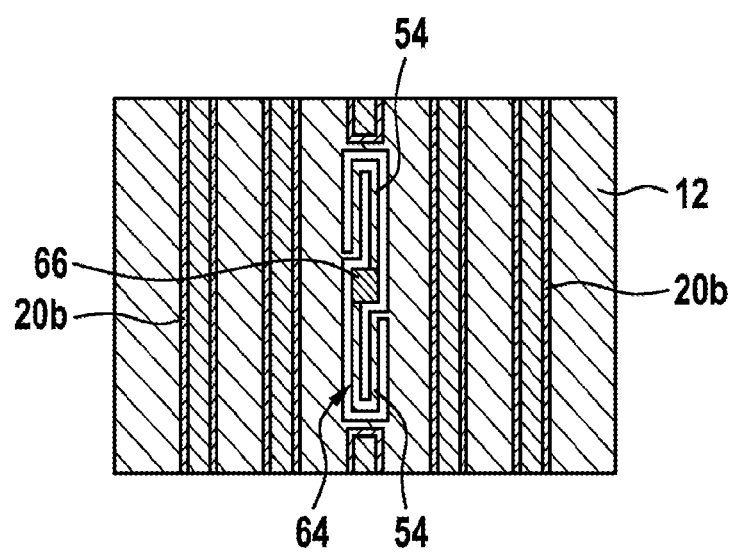
Figure 11:
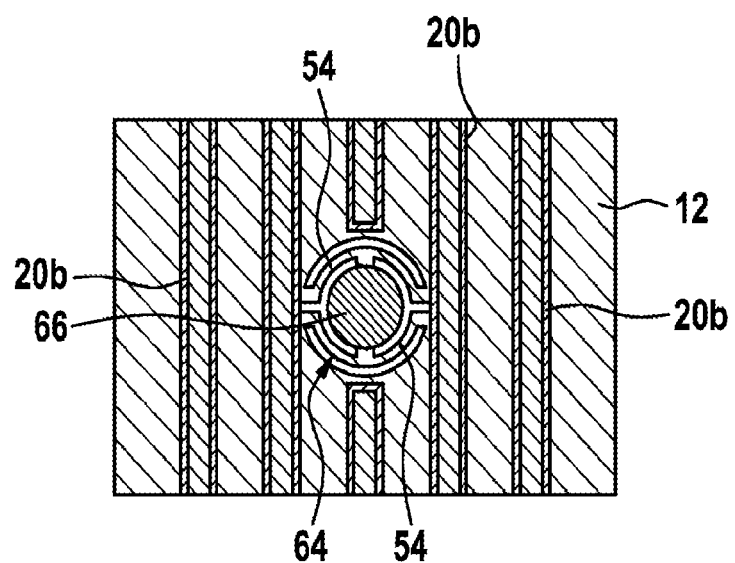

FIGS. 9 through 11 respectively show a schematic partial illustration of a ninth, tenth, and eleventh specific embodiment of the micromechanical component.

As is apparent in FIGS. 9 through 11, the at least one spring-shaped strip conductor 54 may also be situated in a volume 64 that is framed by electrode structure 12. A particularly space-saving arrangement of the at least one spring-shaped strip conductor 54 is achieved in this way. All the above-described forms of the least one spring-shaped strip conductor 54 may preferably be situated in volume 64 that is framed by electrode structure 12 in an even total number, for example as two U springs (FIG. 10) or as four U springs (FIG. 9). Regardless of the even total number, spring-shaped strip conductors 54 may have an optional mirror-symmetrical design with respect to at least one mirror symmetry plane that centrally intersects electrode structure 12 (FIG. 9), or point-symmetrically with respect to a midpoint of electrode structure 12 (FIG. 10).

Regardless of their shapes and their total number, spring-shaped strip conductors 54 may also enclose a central contact area 66, protruding into volume 64, to which spring-shaped strip conductors 54 are mechanically and electrically connected.

In the example in FIG. 11, each of spring-shaped strip conductors 54 is designed in the form of a semicircular web, the two spring-shaped strip conductors 54, having a mirror-symmetrical design with respect to a mirror symmetry plane that centrally intersects an electrode structure 12, framing middle contact area 66 to which they are mechanically and possibly also electrically connected. Instead of two spring-shaped strip conductors 54, each in the form of a semicircular web, four mirror-symmetrical spring-shaped strip conductors 54, each in the form of a quarter-circle web, may be connected to middle contact area 66 and may frame middle contact area 66.

With regard to further properties and features of the micromechanical components of FIGS. 9 through 11 and a manufacturing method that is suitable for manufacturing same, reference is made to the preceding specific embodiments.

Figure 12A:
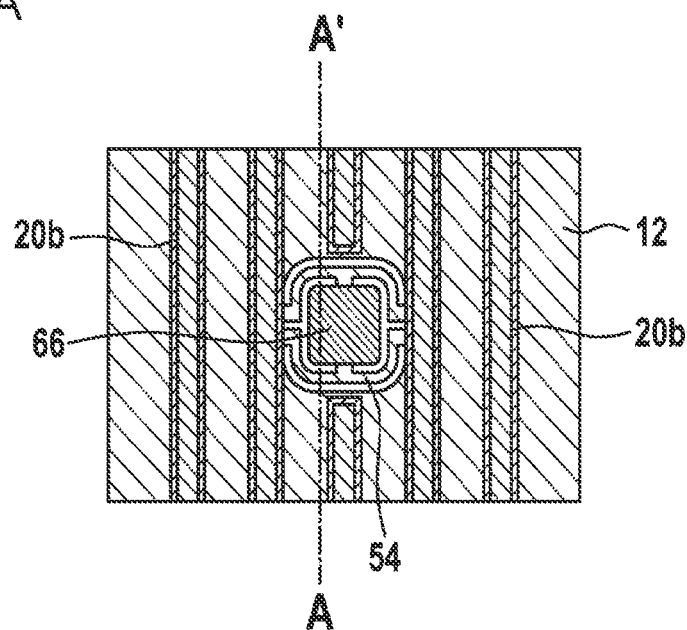
Figure 12B:
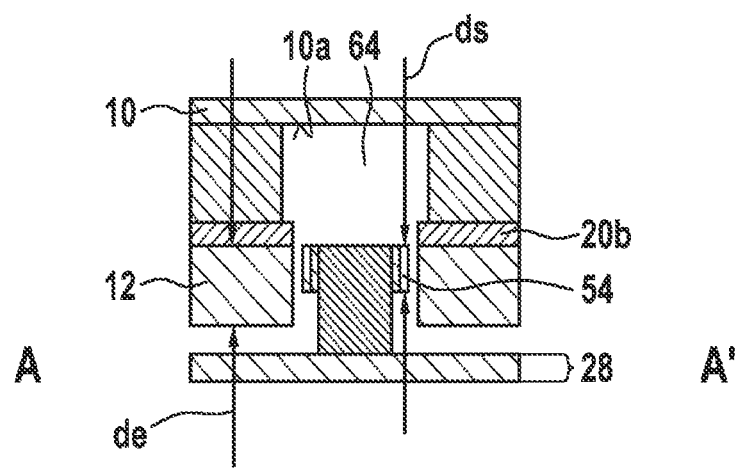

FIGS. 12A and 12B show schematic partial illustrations of a twelfth specific embodiment of the micromechanical component.

As is apparent from the cross section in FIG. 12B, extending along line AA' in FIG. 12A, a spring thickness $d_{spring}$ of the at least one spring-shaped strip conductor 54, oriented perpendicularly with respect to diaphragm 10, may be less than a minimum electrical thickness $d_{electrode}$ of electrode structure 12 that is oriented perpendicularly with respect to diaphragm 10. A design of the at least one spring-shaped strip conductor 54, having spring thickness $d_{spring}$ oriented perpendicularly with respect to diaphragm 10, that is less than minimum electrode thickness $d_{electrode}$ of electrode structure 12, oriented perpendicularly with respect to diaphragm 10, is possible, regardless of the shape of particular spring-shaped strip conductor 54, regardless of its total number, regardless of its mirror symmetry or point symmetry, and regardless of its arrangement "outside electrode structure 12" and/or "inside electrode structure 12."

With regard to further properties and features of the micromechanical component of FIGS. 12A and 12B and a manufacturing method that is suitable for manufacturing same, reference is made to the preceding specific embodiments.

Figure 13A:
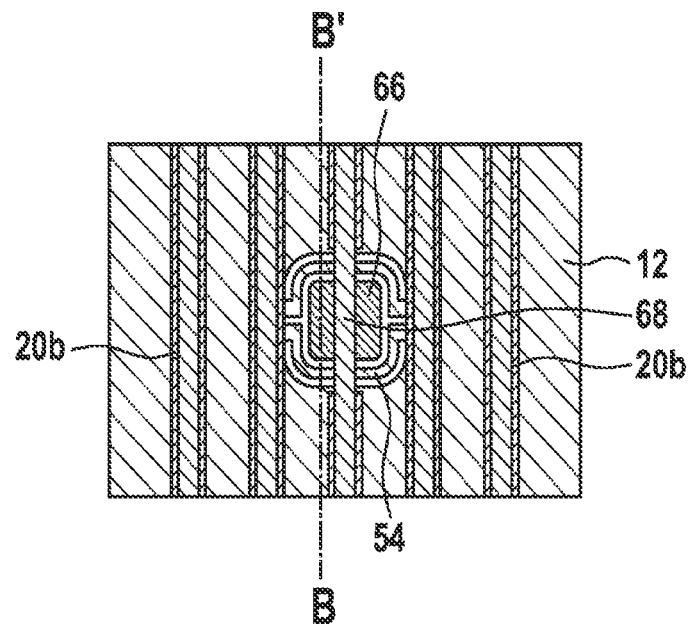
Figure 13B:
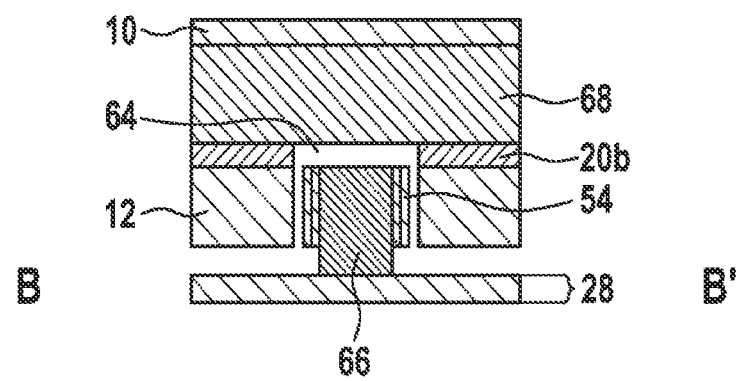

FIGS. 13A and 13B show schematic partial illustrations of a thirteenth specific embodiment of the micromechanical component.

FIG. 13B shows a cross section along line BB' in FIG. 13a. In addition, the at least one spring-shaped strip conductor 54 in FIGS. 13A and 13B is situated in volume 64 that is framed by electrode structure 12. Regardless of the shape of the at least one spring-shaped strip conductor 54, regardless of its total number, and regardless of its mirror symmetry or point symmetry, at least one reinforcement bar 68 protruding through volume 64 may also span the at least one spring-shaped strip conductor 54 on its side directed toward diaphragm 10. The at least one reinforcement bar 68 connected to the diaphragm may improve the rigidity of the diaphragm.

With regard to further properties and features of the micromechanical component of FIGS. 13A and 13B and a manufacturing method that is suitable for manufacturing same, reference is made to the preceding specific embodiments.

All examples explained above for spring-shaped strip conductors 54 allow a flexible electrical strip conductor routing to electrode structure 12.

In one alternative specific embodiment of the examples explained above, residual areas 16*a* and 18*a* may also be made of silicon-rich silicon nitride, while sacrificial layers 16 and 18 in the area of the cavity are made of silicon oxide. To create this configuration, initially a sacrificial layer 16 made of silicon oxide, which is removed outside the subsequent cavity area, i.e., in residual area 16*a*, is preferably initially deposited. A silicon-rich silicon nitride layer made of silicon oxide is subsequently deposited. If a CMP step is now carried out in such a way that in the cavity area the silicon-rich silicon nitride layer on sacrificial layer 16 is removed, a sacrificial layer 16 made of silicon oxide, enclosed by a residual area 16*a* made of silicon-rich silicon nitride, is obtained in the cavity area. Providing a residual area 18*a* made of silicon-rich silicon nitride and a sacrificial layer 18 made of silicon oxide is also correspondingly possible. In addition, an etching channel 40 filled with silicon oxide, which is laterally delimited by silicon-rich silicon nitride and through which an etching medium used to remove sacrificial layers 16 and 18 in the cavity area may be led, may be produced in this way.

In addition, all micromechanical components described above are advantageously suitable for a sensor device or microphone device, in particular for a pressure sensor. Good adjustability of electrode structure 12 due to a pressure change at a diaphragm outer side/detection side of diaphragm 10 directed away from diaphragm inner side 10*a*, or due to an impingement of sound waves at the diaphragm outer side/detection side, is achieved for all micromechanical components described above, a change in capacitance at the measuring capacitor that is formed from electrode structure 12 and counter electrode 30*a* varying (virtually) linearly with respect to the pressure change or sound wave intensity.

What is claimed is:

1. A micromechanical component for a sensor device or microphone device, comprising:
    a diaphragm with a diaphragm inner side, an electrode structure, at least in part, being directly or indirectly connected to the diaphragm inner side;
    a cavity that is formed at least in a volume that is exposed by at least one removed area of at least one sacrificial layer, the diaphragm inner side of the diaphragm adjoining the cavity, and the electrode structure, which is directly or indirectly connected to the diaphragm inner side at least in part, being at least partially enclosed by the cavity;
    at least one residual area made of at least one electrically insulating sacrificial layer material of the at least one sacrificial layer; and
    at least one insulation area made of at least one electrically insulating material that is not the same as the at least one electrically insulating sacrificial layer material, the electrode structure being electrically insulated from the diaphragm, and/or the at least one residual area of the at least one sacrificial layer being delimited from the cavity, using the at least one insulation area;
    wherein at least one conductive component electrically contacts a wiring layer, which, as at least one intermediate layer, at least partially covers a substrate surface of a substrate, the electrode structure being electrically connected to the at least one conductive component via at least one spring-shaped strip conductor.

2. The micromechanical component as recited in claim 1, wherein the at least one residual area is made of silicon dioxide or silicon-rich silicon nitride.

3. The micromechanical component as recited in claim 1, wherein the at least one insulation area is made of silicon nitride, and/or silicon-rich silicon nitride, and/or silicon carbide, and/or aluminum oxide, as the at least one electrically insulating material.

4. The micromechanical component as recited in claim 1, wherein the at least one conductive component, the at least one spring-shaped strip conductor, and the electrode structure being formed from the same electrode material layer.

5. A manufacturing method for a micromechanical component for a sensor device or microphone device, the method comprising:
    establishing a volume of a subsequent cavity of a subsequent micromechanical component at least by forming at least one sacrificial layer made of at least one electrically insulating sacrificial layer material, an electrode structure that is at least partially enclosed by the volume of the subsequent cavity being formed;
    forming a diaphragm of the subsequent micromechanical component, including a diaphragm inner side that delimits the subsequent cavity, the electrode structure, at least in part, being at least partially directly or indirectly connected to the diaphragm inner side;
    forming the cavity of the subsequent micromechanical component at least by removing at least one area of the at least one sacrificial layer made of the at least one electrically insulating sacrificial layer material so that the diaphragm inner side of the diaphragm adjoins the cavity, and the electrode structure, which is directly or indirectly connected to the diaphragm inner side, at least in part, is at least partially enclosed by the cavity, at least one residual area of the at least one sacrificial layer made of the at least one electrically insulating sacrificial layer material still remaining at the micromechanical component; and
    forming at least one insulation area made of at least one electrically insulating material that is not the same as the at least one electrically insulating sacrificial layer material, so that the electrode structure is electrically insulated from the diaphragm and/or the at least one residual area of the at least one sacrificial layer is delimited from the cavity, using the at least one insulation area;
    wherein the removal of the at least one area of the at least one sacrificial layer made of the at least one electrically insulating sacrificial layer material takes place by etching the particular area of the at least one sacrificial layer with an etching medium for which the at least one electrically insulating material of the at least one insulation area has a higher etch resistance than the at least one electrically insulating sacrificial layer material.

6. The manufacturing method as recited in claim 5, wherein the at least one sacrificial layer made of silicon dioxide is formed as the at least one electrically insulating sacrificial layer material.

7. The manufacturing method as recited in claim 5, wherein the at least one insulation area made of silicon nitride, silicon-rich silicon nitride, silicon carbide, and/or aluminum oxide is formed as the at least one electrically insulating material.

8. A manufacturing method for a micromechanical component for a sensor device or microphone device, the method comprising:

establishing a volume of a subsequent cavity of a subsequent micromechanical component at least by forming at least one sacrificial layer made of at least one electrically insulating sacrificial layer material, an electrode structure that is at least partially enclosed by the volume of the subsequent cavity being formed;

forming a diaphragm of the subsequent micromechanical component, including a diaphragm inner side that delimits the subsequent cavity, the electrode structure, at least in part, being at least partially directly or indirectly connected to the diaphragm inner side;

forming the cavity of the subsequent micromechanical component at least by removing at least one area of the at least one sacrificial layer made of the at least one electrically insulating sacrificial layer material so that the diaphragm inner side of the diaphragm adjoins the cavity, and the electrode structure, which is directly or indirectly connected to the diaphragm inner side, at least in part, is at least partially enclosed by the cavity, at least one residual area of the at least one sacrificial layer made of the at least one electrically insulating sacrificial layer material still remaining at the micromechanical component; and forming at least one insulation area made of at least one electrically insulating material that is not the same as the at least one electrically insulating sacrificial layer material, so that the electrode structure is electrically insulated from the diaphragm and/or the at least one residual area of the at least one sacrificial layer is delimited from the cavity, using the at least one insulation area;

wherein for establishing the volume of the subsequent cavity and for forming the electrode structure, a substrate surface of a substrate and/or at least one intermediate layer that at least partially covers the substrate surface is covered with a first sacrificial layer as the at least one sacrificial layer made of the at least one electrically insulating sacrificial layer material, a side of the first sacrificial layer directed away from the substrate is at least partially covered with an electrode material layer so that the electrode structure is formed from at least partial areas of the electrode material layer, and a side of the electrode material layer directed away from the first sacrificial layer is at least partially covered with a second sacrificial layer as the at least one sacrificial layer made of the at least one electrically insulating sacrificial layer material.

9. The manufacturing method as recited in claim 8, wherein at least one conductive component electrically contacts a wiring layer as the at least one intermediate layer that at least partially covers the substrate surface, and the at least one conductive component and a spring-shaped strip conductor are formed in addition to the electrode structure made of the electrode material layer, and the electrode structure is electrically connected to the at least one conductive component via the at least one spring-shaped strip conductor.

10. The manufacturing method as recited in claim 9, wherein a silicon dioxide layer and a silicon-rich silicon nitride layer as at least one further intermediate layer are formed between the wiring layer and the substrate surface, and adjacent to the subsequent cavity, at least one strip conductor is embedded between the silicon dioxide layer and the silicon-rich silicon nitride layer, and is partially electrically connected to the wiring layer through openings in the silicon-rich silicon nitride layer and may extend beyond the cavity.

* * * * *